United States Patent
Auburger et al.

(10) Patent No.: US 7,385,394 B2
(45) Date of Patent: Jun. 10, 2008

(54) INTEGRATED MAGNETIC SENSOR COMPONENT

(75) Inventors: Albert Auburger, Regenstauf (DE); Jochen Dangelmaier, Beratzhausen (DE); Alfred Gottlieb, Nittendorf/Undorf (DE); Martin Petz, Hohenkammer (DE); Uwe Schindler, Reichenbach (DE); Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 11/453,365

(22) Filed: Jun. 15, 2006

(65) Prior Publication Data

US 2007/0145972 A1    Jun. 28, 2007

(51) Int. Cl.
*G01R 33/02* (2006.01)
*H05K 7/04* (2006.01)
*G01B 7/30* (2006.01)

(52) U.S. Cl. .................. 324/252; 361/813; 324/207.25; 324/249

(58) Field of Classification Search ........ 324/173–174, 324/244, 260, 207.25, 252, 249; 361/723, 361/813
See application file for complete search history.

(56) References Cited

U.S. PATENT DOCUMENTS

| | | | |
|---|---|---|---|
| 5,315,245 A | | 5/1994 | Schroeder et al. |
| 5,527,504 A | * | 6/1996 | Kishimoto et al. ........... 419/38 |
| 5,631,557 A | | 5/1997 | Davidson |
| 6,084,401 A | * | 7/2000 | Palma et al. ........... 324/207.21 |
| 6,366,194 B1 | | 4/2002 | Richl et al. |
| 7,220,915 B1 | * | 5/2007 | Park et al. ................. 174/534 |
| 7,250,760 B2 | * | 7/2007 | Ao .............................. 324/252 |
| 2002/0012762 A1 | * | 1/2002 | Bunyan ..................... 428/40.2 |
| 2005/0281009 A1 | * | 12/2005 | Sasaki et al. ............... 361/752 |

FOREIGN PATENT DOCUMENTS

| | | |
|---|---|---|
| DE | 19722507 A1 | 12/1998 |
| DE | 102004010126 A1 | 9/2004 |

* cited by examiner

*Primary Examiner*—Bot LeDynh
(74) *Attorney, Agent, or Firm*—Dicke, Billig, Czaja PLLC

(57) ABSTRACT

A sensor component used to measure a magnetic field strength is disclosed. In one embodiment, the sensor component contains a plurality of leads and a sensor semiconductor chip, which measures the magnetic field strength. The sensor semiconductor chip has pads on its active upper side. These pads are connected electrically to the leads. The sensor component also contains a magnet, which is attached to the leads. The sensor semiconductor chip is arranged on an upper side of the magnet. The sensor component also has a first mold compound which shares a common boundary with the sensor semiconductor chip and surrounds the sensor semiconductor chip, the magnet and parts of the lead.

21 Claims, 3 Drawing Sheets

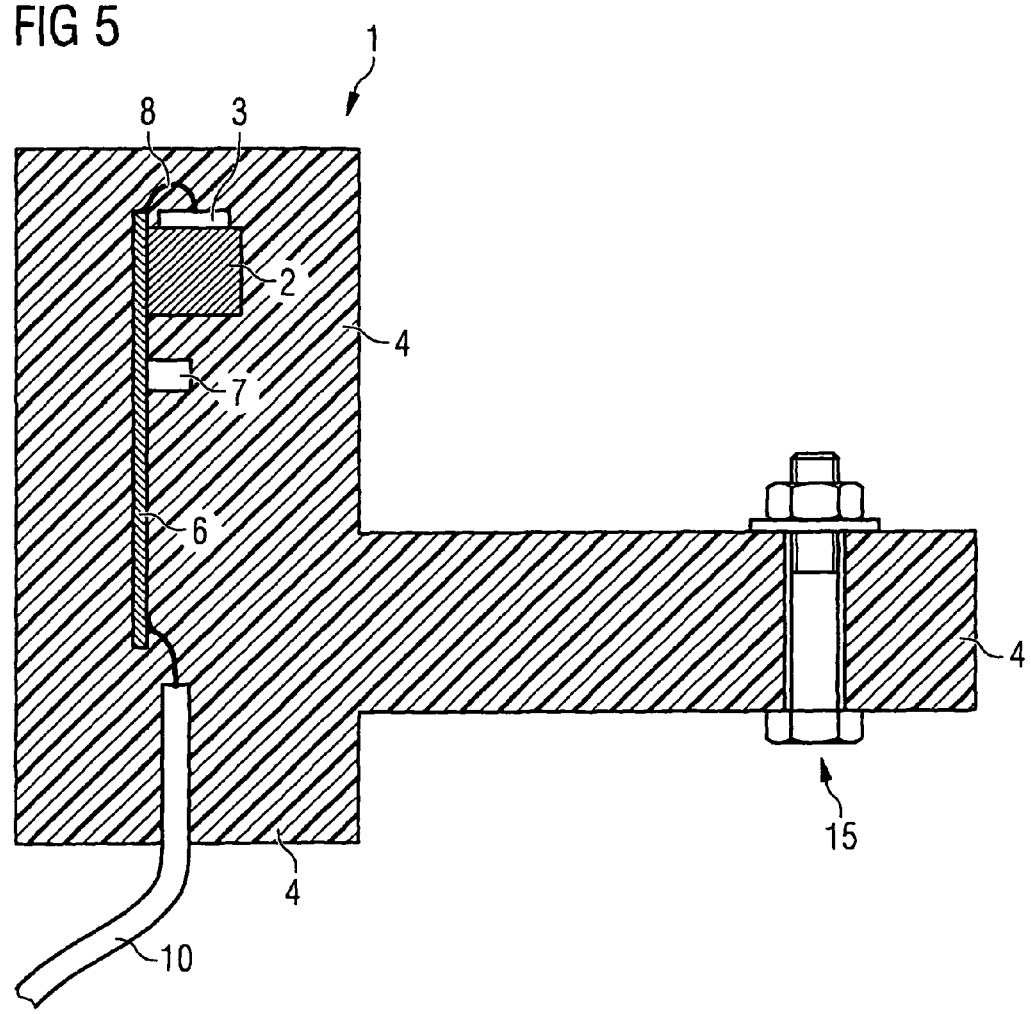

INTEGRATED MAGNETIC SENSOR COMPONENT

CROSS-REFERENCE TO RELATED APPLICATIONS

This Utility Patent Application claims priority to German Patent Application No. DE 10 2005 027 767.5 filed on Jun. 15, 2005, which is incorporated herein by reference.

FIELD OF THE INVENTION

The invention relates to a sensor component and a method for manufacturing a sensor component.

BACKGROUND

Magnetic sensors measure magnetic field strengths and the variation in magnetic field strengths. Typical magnetic sensors use sensor chips with Hall or GMR (Giant Magnetic Resistance) elements. A sensor component with Hall elements is disclosed in U.S. Pat. No. 6,366,194. A sensor chip, which contains Hall elements, is accommodated in a housing and is connected to electrically conducting connection pins projecting from the housing. The sensor component is used for determining a rotor position fitting it on a rotor which guides magnets past the sensor component.

A method is also known for inserting a sensor component described above, with a permanent magnet, in a correspondingly shaped plastic part. A cable is fitted to the connection pins and subsequently the assembly, consisting of sensor, magnet and connection pins, is cast. The rate of rotation is determined when a rotor alters the magnetic field in the vicinity of the sensor through its rotation, for example when the rotor guides an electrical conductor, a so-called sensor wheel, past the sensor.

A feature of sensors for measuring magnetic field strength is their sensitivity. Sensitivity describes the deviations of the magnetic field that must be reliably measured. In conventional sensor components, low sensitivity results in inaccurate measuring results or reduced yields in the manufacture of sensor components.

For these and other reasons, there is an need for the present invention.

SUMMARY

The present invention provides a sensor component used to measure a magnetic field strength. In one embodiment, the sensor component contains a plurality of leads and a sensor semiconductor chip, which measures the magnetic field strength. The sensor semiconductor chip has pads on its active upper side. These pads are connected electrically to the leads. The sensor component also contains a magnet, which is attached to the leads. The sensor semiconductor chip is arranged on an upper side of the magnet. The sensor component also has a first mold compound which shares a common boundary with the sensor semiconductor chip and surrounds the sensor semiconductor chip, the magnet and parts of the lead.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 illustrates a further exemplary embodiment of the sensor component according to the invention with a fastening device for the sensor component.

DETAILED DESCRIPTION

Figure 1:
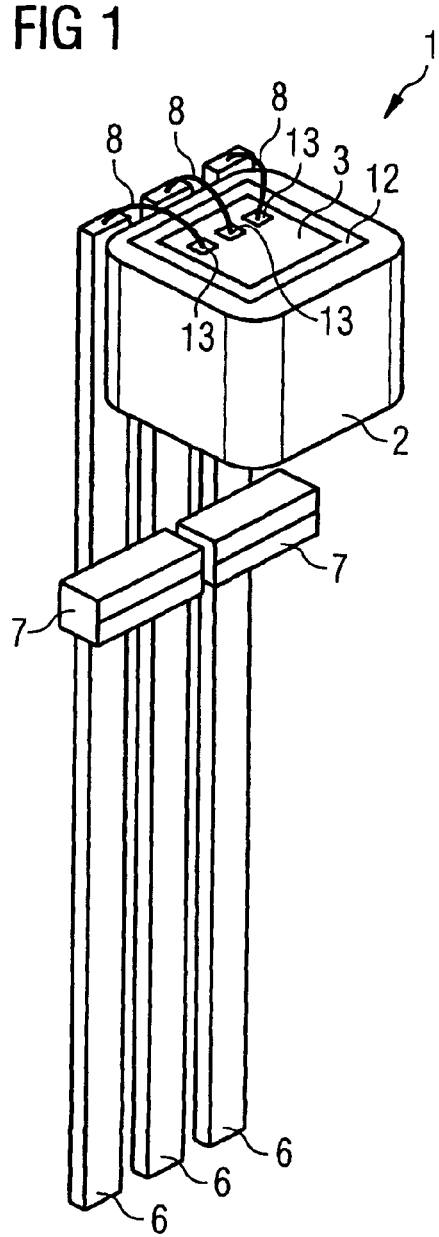
FIG. 1 illustrates a sensor component according to the invention before molding with a mold compound.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a sensor component with high sensitivity for measuring magnetic field strength. Further, the present invention provides a method for manufacturing such a sensor component.

According to one embodiment of the invention a sensor component is provided for measuring a magnetic field strength. The sensor component has a plurality of leads and a sensor semiconductor chip. The sensor semiconductor chip measures magnetic field strength, e.g. with Hall or GMR elements. On its active surface the sensor semiconductor chip has pads which are connected electrically to the leads. The sensor component on whose upper side the sensor semiconductor chip is fitted contains a plurality of leads. The magnet is attached to the leads.

A first mold compound surrounds the sensor semiconductor chip, the magnet and parts of the leads. Here the first mold compound shares a common boundary with the sensor semiconductor chip, by which is meant, in this context, a chip without the mold compound surrounding it. This means that the mold compound that surrounds the sensor semiconductor chip also encloses the magnet and parts of the leads. The arrangement means that the magnet is fitted very close to the sensor semiconductor chip. The strength of the magnetic field in the sensor semiconductor chip is therefore high. Moreover, the distance between the sensor semiconductor chip and the sensor wheel can be reduced.

Only one mold compound, which surrounds the sensor semiconductor chip and the magnet, is required. A further mold compound, which individually encloses the magnet, but increases the distance between the sensor semiconductor chip and the magnet, is not necessary. The small gap between the sensor semiconductor chip and the sensor wheel enables movements of the sensor wheel to be reliably detected by the sensor semiconductor chip.

Not only an additional mold compound but also an additional plastic part are dispensed with as a result of the proposed construction. This reduces the material costs of the sensor component. The short distances between the magnet and the sensor semiconductor unit also mean that a smaller space is required for the sensor component, which in turn facilitates its installation in devices in which little space is available.

In one embodiment, the magnet is a permanent magnet. Such a magnet can provide such a high magnetic field strength that it can be reliably measured by the sensor semiconductor chip.

Such a magnet may consist of an alloy, e.g. an Al/Ni/Co alloy. Such alloys have very good thermal properties and display good mechanical stability. The alloy Nd2Fe14B provides very high field strengths, and it has a high energy value and good mechanical resistivity.

Alloys of rare earth cobalt such as SmCo5 and Sm2Co17 have a high magnetic field strength, good long-term stability and cover a relatively high temperature range.

In a further embodiment the magnet consists of a hard ferrite, e.g. an iron oxide with barium oxide or strontium carbonate. Such a substance has a favorable price, does not oxidize and has a high coercitive field strength.

Although the gap between the active surface of the sensor semiconductor chip and the sensor wheel is enlarged if the sensor semiconductor chip with its active upper side is directed toward the magnet, and if the pads are electrically connected to the inner connection elements by flip-chip contacts, no bond wire projecting from the sensor semiconductor chip is required. In the case of small chip thicknesses, e.g. chip thicknesses less than 150 µm, the air gap is even further reduced.

Alternatively the sensor semiconductor chip, with its active upper side, points away from the magnet, and the pads are electrically connected to the leads by bond wires. This is particularly recommended in the case of thicker sensor semiconductor chips in order to keep the gap small between the magnet and the sensor semiconductor chip.

Further passive components, particularly capacitors, may be integrated in the sensor component, these further components being surrounded by the first mold compound. Obviously the passive components may advantageously be installed close to the sensor semiconductor chip, which reduces the overall size of the sensor component.

If the leads are bent so that they project centrally from the sensor component, the sensor component according to the invention can also be installed where conventional sensor components were previously installed. This is possible without having to take further conversion measures because of a variable position of the connections.

By bending the leads in their upper region they may be shaped so that they run over the upper side of the magnet on which the sensor semiconductor chip is fitted. The sensor semiconductor chip is in this case normally fitted above the lead, thus enabling the magnet to be attached to the lead both on its side and on its upper side. Moreover, bonding of the sensor semiconductor chip to the lead is facilitated because a larger surface area on which the bond wire can be attached is available on the side of the lead.

A soft magnetic homogenizing plate, which is fitted between the sensor semiconductor chip and the magnet, has a low magnetic resistance but ensures that spatial inhomogeneities resulting from the structure of the magnet are compensated for. The sensor semiconductor chip is therefore located in a homogeneous magnetic field, regardless of the fact that different magnets have different inhomogeneities. This allows more reliable detection of the magnetic field strength.

If the first mold compound consists of a thermoset the sensor component is extremely temperature stable, for thermosets cannot be melted and are rigid up to the temperature of decomposition. In a further embodiment of the invention the leads are electrically connected to a cable and are accessible from the outside of the sensor component via this cable. The connection points between the lead and the cable are also surrounded by the first mold compound, thus protecting the connection points even when the cable is subjected to mechanical load.

The sensor component according to the invention may be used for a plurality of applications, e.g. for transverse and longitudinal acceleration measurements, but it is ideal for rotation rate sensors. They must be extremely sensitive because of the air gap between the sensor semiconductor chip and the sensor wheel.

The invention also relates to a method for manufacturing a sensor component which is used for measuring a magnetic field strength. A plurality of leads are initially provided. In addition, a magnet is made available and a sensor semiconductor chip, which measures the magnetic field strength, is provided. The sensor semiconductor chip has pads on its active upper side, by means of which the sensor semiconductor chip can be contacted electrically from the outside.

The magnet is attached to the leads, and the sensor semiconductor chip is arranged on an upper side of the magnet. This sequence can be reversed.

The pads of the sensor semiconductor chip are electrically connected to leads and the magnet, the sensor semiconductor chip and the leads are cast with a first mold compound. This casting is carried out so that the mold compound shares a common boundary with the sensor semiconductor chip, which means that the mold compound that surrounds the sensor semiconductor chip also encloses the magnet and at least parts of the lead.

In the given method the sensor component need only be molded once. The distances between the active upper side of the sensor semiconductor unit and the sensor wheel, and between the magnet and the active upper side, are therefore small. This saves the material costs of molding twice and the costs of any plastic parts into which the magnet and sensor semiconductor chip are inserted.

If the leads are supplied in the form of a lead frame, the positions of the leads relative to each other are fixed when the magnet is attached. This also facilitates the installation of the connecting elements between the sensor semiconductor chip and the leads.

With the sensor semiconductor chips arranged on the upper side of the magnet, the active upper side of the sensor semiconductor chip can be aligned to the magnet and the pads of the sensor semiconductor chip can be connected electrically by flip-chip contacts to the lead. All the pads can be connected simultaneously by means of the flip-chip contacts, which reduces the assembly time.

Alternatively the sensor semiconductor chip is aligned so that the side opposite the active upper side points toward the magnet. The pads are then connected to the leads by bond wires. This is particularly suitable for very thick chips. Here the distance between the sensor semiconductor chip and the magnet is reduced, which only slightly increases the distance between the sensor semiconductor chip and the sensor wheel.

If further electrical components, particularly capacitors, are enclosed by the first mold compound, the packing density of the entire assembly of sensor component and capacitors is also reduced.

By molding the sensor component with a further thermoplastic mold compound, a plurality of shapes can easily be realized for the sensor component.

By fitting a soft magnetic homogenizing plate before enclosing electrical components by the first mold compound, between the sensor semiconductor chip and the magnet, the sensitivity of the sensor component is further increased because the homogenizing plate is also enclosed by the first mold compound. It is therefore located close to the sensor semiconductor chip that the homogenizing plate is most effective.

If cables are connected to the leads, and the cables remain accessible from the outside after spraying with the first mold compound, a single spraying process is sufficient to complete the final sensor component.

FIG. 1 illustrates a sensor component according to the invention. Component 1 according to the invention has leads 6 to which a magnet 2 is attached. The north pole of magnet 2 is denoted by N and is illustrated at the top of the figure, whilst the south pole, denoted by S, is arranged in the lower region of the magnet. A homogenizing plate 12 and a sensor semiconductor chip 3 located on homogenizing plate 12 are illustrated above magnet 2.

Sensor semiconductor chip 3 has three pads 13 which are connected to leads 6 by bond wires 8. Moreover, two capacitors 7 are attached to leads 6 underneath magnet 2. The upper side of sensor semiconductor chip 3, on which pads 13 are applied, is referred to as the active upper side. The sensitivity of the sensor component illustrated is high because the distance between the active upper side and the north pole N of magnet 2 is short.

Figure 2:
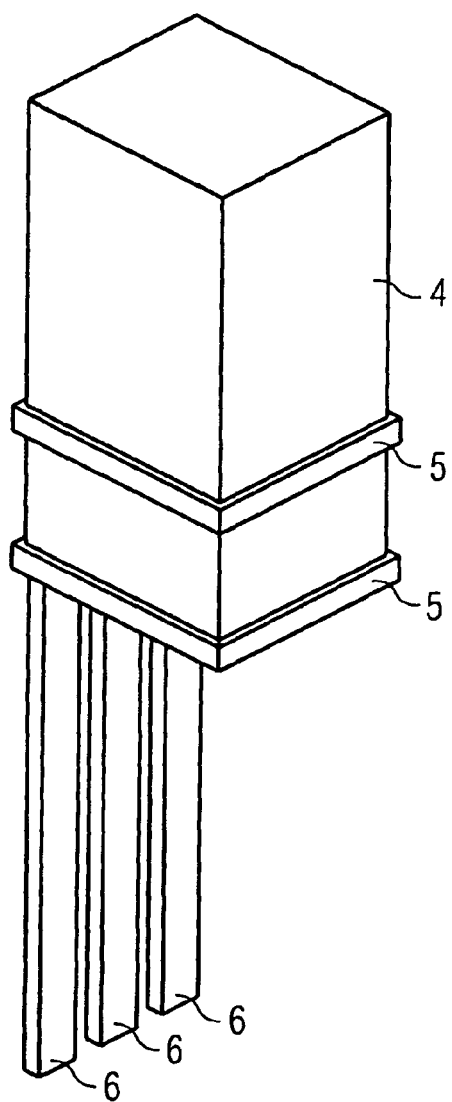
FIG. 2 illustrates the sensor component according to the invention before molding with a mold compound.

FIG. 2 illustrates the sensor semiconductor component in FIG. 1 after the first mold compound 4 has been applied. First mold compound 4 encloses the upper parts of leads 6, magnet 2, sensor semiconductor chip 3, homogenizing plate 12 and capacitors 7. The sensor component illustrated has two elevations 5, which facilitate installation, e.g. on a rotor.

Figure 3:
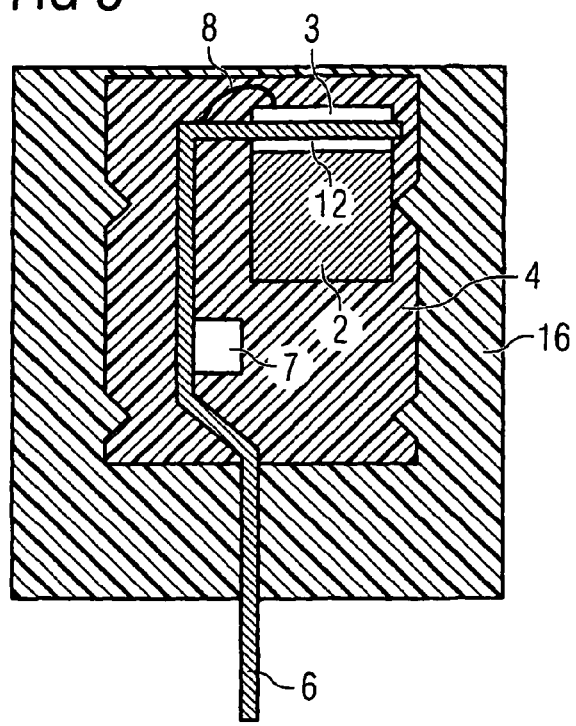
FIG. 3 illustrates a further embodiment of the sensor component according to the invention with bond wires as connecting elements.

FIG. 3 illustrates diagrammatically, in section, a further exemplary embodiment of the sensor component according to the invention. Components with the same functions as illustrated in the preceding figures are denoted by the same references and are not explained further. Leads 6, only one of which is illustrated in FIG. 3, are bent twice in the lower region and once in the upper region of first mold compound 4.

In the lower region of mold compound 4 the bends cause lead 6 to project centrally from first mold compound 4. In the upper area leads 6 are bent so that they run horizontally there.

Homogenizing plate 12 and magnet 2 are fitted underneath the horizontal region of lead 6, whilst sensor semiconductor chip 3 lies above the horizontally running region of lead 6, and is electrically connected to lead 6 by bond wire 8. The assembly having magnet 2, homogenizing plate 12, sensor semiconductor chip 3, bond wire 8, the upper region of lead 6 and capacitors 7, is surrounded by first mold compound 4. The assembly, including first mold compound 4, is surrounded by a further mold compound 16.

Figure 4:
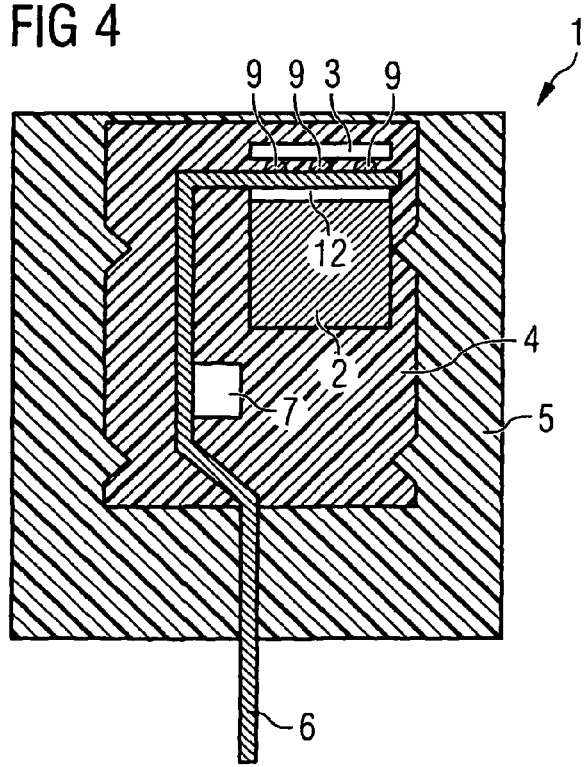
FIG. 4 illustrates a further exemplary embodiment of the sensor component according to the invention with flip-chip contacts as connecting elements.

A further exemplary embodiment of the sensor component according to the invention is illustrated in FIG. 4. Here, however, sensor semiconductor chip 3 is fitted so that its active upper side is aligned to the magnet so that it lies underneath. The electrical contact with leads 6 is made by flip-chip contacts 9.

FIG. 5 illustrates a further exemplary embodiment of the sensor semiconductor unit according to the invention with a fastening device. Leads 6 may be connected from outside by means of a cable 10. Cable 10 and the connection point between cable 10 and lead 6 are enclosed by the first mold compound like other components of the sensor component. First mold compound 4 widens outwards in the lower region, where a screwed connection 15 is fitted. Sensor component 1 can be installed in an automobile, for example, by means of this connection.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A sensor component for measuring a magnetic field strength, wherein the sensor component comprises:
   a plurality of leads:
   a sensor semiconductor chip configured to measure the magnetic field strength, wherein the sensor semiconductor chip has pads on its active upper side and the pads are electrically connected to the leads;
   a magnet attached to the leads, wherein the sensor semiconductor chip is arranged on an upper side of the magnet; and
   first mold compound, which shares a common boundary with the sensor semiconductor chip, and surrounds the sensor semiconductor chip, the magnet and parts of the lead wherein a soft magnetic homogenizing plate is fitted between the sensor semiconductor chip and the magnet.

2. The sensor component as claimed in claim 1, wherein the magnet is a permanent magnet.

3. The sensor component as claimed in claim 2, wherein the magnet consists of an alloy.

4. The sensor component as claimed in claim 2, wherein the magnet consists of a hard ferrite.

5. The sensor component as claimed in claim 1, wherein the active upper side of the sensor semiconductor chip is directed toward the magnet and the pads are electrically connected to the leads by flip-chip contacts.

6. The sensor component as claimed in claim 1, wherein the sensor semiconductor chip is aligned so that it points toward the magnet on the side opposite the active upper side, and wherein the pads of the sensor semiconductor chip are electrically connected to the leads by bond wires.

7. The sensor component as claimed in claim 1, which has further passive components, including capacitors, wherein the further passive components are also enclosed by the first mold compound.

8. The sensor component as claimed in claim 1, wherein the leads are bent so that they project centrally from the sensor component.

9. The sensor component as claimed in claim 1, wherein the leads are bent so that in their upper region they run on the upper side of the magnet on which the sensor semiconductor chip is fitted.

10. The sensor component as claimed in claim 1, wherein the magnet is glued to the leads.

11. The sensor component as claimed in claim 1, wherein the first mold compound consist of a thermoset.

12. A sensor component for measuring a magnetic field strength wherein the sensor component comprises:
   a plurality of leads:
   a sensor semiconductor chip configured to measure the magnetic field strength wherein the sensor semiconductor chip has pads on its active upper side and the pads are electrically connected to the leads;
   a magnet attached to the leads, wherein the sensor semiconductor chip is arranged on an upper side of the magnet; and
   first mold compound, which shares a common boundary with the sensor semiconductor chip, and surrounds the sensor semiconductor chip, the magnet and parts of the lead, wherein the first mold compound is surrounded by a further mold compound consisting of a thermoplastic.

13. A sensor component for measuring a magnetic field strength, wherein the sensor component comprises:
   a plurality of leads;
   a sensor semiconductor chip configured to measure the magnetic field strength, wherein the sensor semiconductor chip has pads on its active upper side and the pads are electrically connected to the leads;
   a magnet attached to the leads, wherein the sensor semiconductor chip is arranged on an upper side of the magnet; and
   first mold compound, which shares a common boundary with the sensor semiconductor chip, and surrounds the sensor semiconductor chip, the magnet and parts of the lead, wherein the leads are connected electrically to a cable and the connection points between the leads and the cable are surrounded by the first mold compound.

14. The sensor component as claimed in claim 1, wherein the sensor is a rotation rate sensor.

15. A method for manufacturing a sensor component for measuring a magnetic field strength, comprising:
   providing of a plurality of leads;
   providing of a magnet;
   providing of a sensor semiconductor chip configured to measure the magnetic field strength, wherein the sensor semiconductor chip has pads on its active upper side;
   securing the magnet to the leads;
   arranging the sensor semiconductor chip on an upper side of the magnet;
   electrical connection of the pads of the sensor semiconductor chip to the leads; and
   enclosing the magnet, the sensor semiconductor chip and parts of the leads with a first mold compound so that the first mold compound shares a common boundary with the sensor semiconductor chip, wherein the sensor component is sprayed, with a further mold compound consisting of a thermoplastic.

16. The method as claimed in claim 15, wherein the leads are supplied as part of a lead frame.

17. The method as claimed in claim 15, wherein the active upper side of the sensor semiconductor chip is aligned to the magnet, and the pads are connected electrically to the leads by flip-chip contacts.

18. The method as claimed in claim 15, wherein the sensor semiconductor chip is aligned so that it points toward the magnet on the side opposite the active upper side, and the pads are connected electrically to the leads by bond wires.

19. The method as claimed in claim 15, wherein further electrical components are supplied which are also enclosed by the first mold compound.

20. A method for manufacturing a sensor component for measuring a magnetic field strength, comprising:
   providing of a plurality of leads;
   providing of a magnet;
   providing of a sensor semiconductor chip configured to measure the magnetic field strength, wherein the sensor semiconductor chip has pads on its active upper side;
   securing the magnet to the leads;
   arranging the sensor semiconductor chip on an upper side of the magnet;
   electrical connection of the pads of the sensor semiconductor chip to the leads; and
   enclosing the magnet, the sensor semiconductor chip and parts of the leads with a first mold compound so that the first mold compound shares a common boundary with the sensor semiconductor chip, wherein a soft magnetic honmogenizing plate is fitted between the sensor semiconductor chip and the magnet, and the soft magnetic homogenizing plate is also enclosed by the first mold compound.

21. The method as claimed in claim 20, wherein a cable is connected to the leads, and this cable is accessible from the outside.

* * * * *

UNITED STATES PATENT AND TRADEMARK OFFICE
CERTIFICATE OF CORRECTION

| | |
|---|---|
| PATENT NO. | : 7,385,394 B2 |
| APPLICATION NO. | : 11/453365 |
| DATED | : June 10, 2008 |
| INVENTOR(S) | : Albert Auburger et al. |

It is certified that error appears in the above-identified patent and that said Letters Patent is hereby corrected as shown below:

Column 6, line 32, Claim 1, delete ":" and insert in place thereof --;--.

Column 7, line 11, Claim 12, delete ":" and insert in place thereof --;--.

Column 8, line 40, Claim 20, delete "honmogenizing" and insert in place thereof --homogenizing--.

Signed and Sealed this

Fourteenth Day of April, 2009

JOHN DOLL
*Acting Director of the United States Patent and Trademark Office*